United States Patent
Sekiyama et al.

(10) Patent No.: US 11,967,530 B2
(45) Date of Patent: Apr. 23, 2024

(54) METHOD FOR PRODUCING GAN LAYERED SUBSTRATE

(71) Applicant: SHIN-ETSU CHEMICAL CO., LTD., Tokyo (JP)

(72) Inventors: Sumio Sekiyama, Annaka (JP); Yoshihiro Kubota, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 725 days.

(21) Appl. No.: 17/251,483

(22) PCT Filed: Jun. 11, 2019

(86) PCT No.: PCT/JP2019/023032
§ 371 (c)(1),
(2) Date: Dec. 11, 2020

(87) PCT Pub. No.: WO2019/240113
PCT Pub. Date: Dec. 19, 2019

(65) Prior Publication Data
US 2021/0111076 A1    Apr. 15, 2021

(30) Foreign Application Priority Data
Jun. 13, 2018  (JP) .................................. 2018-112525

(51) Int. Cl.
*B32B 43/00* (2006.01)
*B32B 9/00* (2006.01)
(Continued)

(52) U.S. Cl.
CPC .......... *H01L 21/7813* (2013.01); *B32B 9/005* (2013.01); *B32B 37/025* (2013.01);
(Continued)

(58) Field of Classification Search
CPC ............. B32B 43/006; Y10T 156/1184; Y10T 156/1967
See application file for complete search history.

(56) References Cited

U.S. PATENT DOCUMENTS

| | | |
|---|---|---|
| 2008/0111144 A1 | 5/2008 | Fichtenbaum et al. |
| 2009/0221131 A1* | 9/2009 | Kubota ................... C30B 29/40 438/478 |

(Continued)

FOREIGN PATENT DOCUMENTS

| | | |
|---|---|---|
| JP | 2010-509177 A | 3/2010 |
| JP | 2011-193010 A | 9/2011 |

(Continued)

OTHER PUBLICATIONS

International Search Report, issued in PCT/JP2019/023032, PCT/ISA/210, dated Jul. 30, 2019.
(Continued)

*Primary Examiner* — Philip C Tucker
*Assistant Examiner* — Nickolas R Harm
(74) *Attorney, Agent, or Firm* — Birch, Stewart, Kolasch & Birch, LLP

(57) ABSTRACT

Provided is a method for producing a GaN layered substrate, comprising the steps of: subjecting a C-plane sapphire substrate 11 having an off-angle of 0.5° to 5° to a high-temperature nitriding treatment at 800° C. to 1,000° C. to carry out a surface treatment of the C-plane sapphire substrate; carrying out epitaxial growth of GaN on the surface of the surface-treated C-plane sapphire substrate 11 to produce a GaN film carrier having a surface of an N polar face; forming an ion implantation region $13_{ion}$ by carrying out ion implantation on the GaN film 13; laminating and joining a support substrate 12 with the GaN film-side surface of the ion-implanted GaN film carrier; and separating at the ion-implanted region $13_{ion}$ in the GaN film 13 to transfer a (Continued)

GaN thin film 13a onto the support substrate 12, to produce a GaN layered substrate 10 having, on the support substrate 12, a GaN thin film 13a having a surface of a Ga polar face. A GaN layered substrate having a good crystallinity and a surface of a Ga face is obtained by a single transfer process.

11 Claims, 1 Drawing Sheet

(51) Int. Cl.
  *B32B 37/00* (2006.01)
  *B32B 38/00* (2006.01)
  *C23C 16/30* (2006.01)
  *C30B 25/18* (2006.01)
  *C30B 29/40* (2006.01)
  *C30B 31/22* (2006.01)
  *H01L 21/02* (2006.01)
  *H01L 21/78* (2006.01)
(52) U.S. Cl.
  CPC ........ *B32B 38/0008* (2013.01); *C23C 16/303* (2013.01); *C30B 25/186* (2013.01); *C30B 29/406* (2013.01); *C30B 31/22* (2013.01); *H01L 21/0242* (2013.01); *H01L 21/02433* (2013.01); *H01L 21/02458* (2013.01); *H01L 21/0254* (2013.01); *H01L 21/0262* (2013.01); *B32B 43/006* (2013.01); *B32B 2310/0881* (2013.01); *Y10T 156/1184* (2015.01); *Y10T 156/1967* (2015.01)

(56) References Cited

U.S. PATENT DOCUMENTS

| | | | |
|---|---|---|---|
| 2012/0223329 A1* | 9/2012 | Kinoshita | ............. C30B 25/186 257/E29.089 |
| 2013/0115753 A1 | 5/2013 | Eo et al. | |
| 2014/0065360 A1* | 3/2014 | D'Evelyn | ............... C30B 25/18 428/141 |
| 2014/0197419 A1 | 7/2014 | Henley et al. | |
| 2014/0357053 A1 | 12/2014 | Sun et al. | |
| 2017/0365667 A1 | 12/2017 | Sato | |
| 2018/0138357 A1* | 5/2018 | Henley | ............... H01L 33/0075 |
| 2018/0158680 A1* | 6/2018 | Fujikura | ........... H01L 21/02694 |
| 2019/0057865 A1* | 2/2019 | Oshima | ............... H01L 21/0242 |

FOREIGN PATENT DOCUMENTS

| | | |
|---|---|---|
| JP | 2013-98572 A | 5/2013 |
| JP | 2015-518265 A | 6/2015 |
| JP | 2016-511934 A | 4/2016 |
| JP | 2017-228578 A | 12/2017 |
| WO | WO2016/205751 A1 | 12/2016 |

OTHER PUBLICATIONS

Written Opinion of the International Searching Authority, issued in PCT/JP2019/023032, PCT/ISA/237, dated Jul. 30, 2019.

* cited by examiner

METHOD FOR PRODUCING GAN LAYERED SUBSTRATE

TECHNICAL FIELD

The present invention relates to a method for producing a GaN layered substrate whose surface is a Ga polar face (Ga face).

BACKGROUND ART

Crystalline GaN has a wider bandgap over Si and GaAs, and is promising for use as a material for high-speed and high-power devices. However, in particular, bulk GaN substrates having good crystallinity have a small diameter and are very expensive, resulting in hindrance to widespread use of the bulk GaN substrates.

On the other hand, a GaN thin film with a relatively large diameter is obtained by heteroepitaxial growth of GaN on an AlN substrate or $Al_2O_3$ (sapphire) substrate using a hydride vapor phase epitaxy method (HVPE method) or a metal organic chemical vapor deposition method (MOCVD method), but such a GaN thin film does not have very high characteristics.

In addition, a layered substrate with a GaN thin film formed on a Si substrate which is widely and generally used as a semiconductor material is highly expected as a substrate for a high-performance device substrate because the layered substrate has excellent basic characteristics from GaN, and advanced process techniques can be adapted thereto.

Here, as a method for forming a GaN thin film on a Si substrate, a method has been developed in which GaN is formed directly on a Si<111> face by a heteroepitaxial growth method. A large-diameter substrate with a diameter of 200 mm has been already put into practical use.

However, in this method, it is absolutely necessary to provide a thick buffer layer between the Si substrate and the GaN thin film in order to obtain GaN with good crystallinity. This is because there is the problem that warpage occurs in a layered substrate due to a large difference in thermal expansion coefficient between the GaN film and the Si substrate, and the warpage increases as the GaN thickness becomes larger, leading to generation of various defects. That is, an increase in warpage of the layered substrate causes the problem that the layered substrate eventually breaks, and various problems occur in semiconductor device processes even if the layered substrate does not break. Particularly in the microfabrication exposure process, a serious problem may occur. Therefore, it is necessary that a thick buffer layer having a thermal expansion coefficient between those of the Si substrate and the GaN thin film is inserted between these two materials for relaxing the warpage. In addition, it is difficult to thicken the GaN layer with good characteristics on the layered substrate by this method.

As a solution for such a problem, there may be a method for producing a GaN layered substrate by transfer in accordance with the following procedure.

That is, first, a first substrate is prepared, and a GaN film having a thickness of a certain level or more is epitaxially grown on a surface of the substrate. Next, this substrate is subjected to ion implantation to form an embrittlement layer (ion implantation region) at a certain depth from the surface. This substrate is bonded to a second substrate, and then delaminated at the embrittlement layer, so that the GaN thin film is transferred to the second substrate to obtain a GaN layered substrate.

Here, in general GaN epitaxial growth (i.e. a GaN epitaxial growth film formed on the first substrate), the growth face (surface) is a Ga polar face (hereinafter, Ga face). Accordingly, the ion implantation face is a Ga face, and the surface after transfer onto the second substrate by delamination is an N polar face (N face). Here, since the device production face needs to be a Ga face for electronic component applications, it is necessary that the GaN thin film transferred to the second substrate is re-bonded and thus transferred to a third substrate to ensure that the surface is a Ga face. Thus, many attempts have been heretofore made to ensure that the surface after transfer onto the second substrate by delamination is a Ga face (i.e. the epitaxial growth face on the first substrate is an N face). However, in epitaxial growth on the N face, the GaN film normally has poor crystallinity, so that it is difficult to use a GaN layered substrate for device applications.

In view of the above-described characteristics of GaN epitaxial growth, it is necessary to ensure that the final growth face (surface) of the GaN layered substrate is a Ga face, and thus the GaN thin film has to be transferred twice reluctantly. Thus, the process becomes complicated, resulting in low yield and high cost.

As a prior art related to the present invention, JP-T 2016-511934 (Patent Document 1) can be mentioned.

PRIOR ART DOCUMENTS

Patent Documents

Patent Document 1: JP-T 2016-511934

SUMMARY OF INVENTION

Technical Problem

The present invention has been made in view of the above-described circumstances, and an object of the present invention is to provide a method for producing a GaN layered substrate, by which a GaN layered substrate with good crystallinity, whose surface is a Ga face, can be obtained by one transfer process.

Solution to Problem

The present invention provides the following methods for producing a GaN layered substrate in order to achieve the above-described object.

1.

A method for producing a GaN layered substrate, including the steps of:

subjecting a C-plane sapphire substrate having an off-angle of 0.5 to 5 degrees to a high-temperature nitriding treatment at 800° C. to 1,000° C. and/or a treatment for deposition of crystalline AlN on the C-plane sapphire substrate to carry out a surface treatment of the C-plane sapphire substrate;

carrying out epitaxial growth of GaN on the surface of the surface-treated C-plane sapphire substrate to produce a GaN film carrier having a surface of an N polar face;

forming an ion implantation region by carrying out ion implantation on the GaN film;

laminating and bonding a support substrate with the GaN film-side surface of the ion-implanted GaN film carrier; and performing delamination at the ion-implanted region in the GaN film to transfer a GaN thin film onto the support substrate, to obtain a GaN layered substrate having, on the support substrate, a GaN thin film whose surface is a Ga polar face.

2.

The method for producing a GaN layered substrate according to 1, wherein the GaN epitaxial growth is carried out at a higher temperature than the high-temperature nitriding treatment.

3.

The method for producing a GaN layered substrate according to 1 or 2, wherein the GaN epitaxial grown is carried out by a MOCVD method.

4.

The method for producing a GaN layered substrate according to any one of 1 to 3, wherein after the surface treatment of the C-plane sapphire substrate is carried out, a GaN buffer layer is formed at 700° C. or lower, and the GaN epitaxial growth is then carried out on the GaN buffer layer.

5.

The method for producing a GaN layered substrate according to 4, wherein the thickness of the GaN buffer layer is 15 nm to 30 nm.

6.

The method for producing a GaN layered substrate according to any one of 1 to 5, wherein after the GaN film is formed by the epitaxial growth, a silicon oxide film is further formed on the GaN film to obtain the GaN film carrier.

7.

The method for producing a GaN layered substrate according to any one of 1 to 6, wherein before the ion implantation, the ion implantation surface of the GaN film carrier is smoothed to an arithmetic mean roughness Ra of 0.3 nm or less.

8.

The method for producing a GaN layered substrate according to any one of 1 to 7, wherein the ion implantation is a treatment using hydrogen ions ($H^+$) and/or hydrogen-molecule ions ($H_2^+$) at an implantation energy of 100 keV to 160 keV and a dose of $1.0 \times 10^{17}$ atom/cm$^2$ to $3.0 \times 10^{17}$ atom/cm$^2$.

9.

The method for producing a GaN layered substrate according to any one of 1 to 8, wherein the support substrate is made of Si, $Al_2O_3$, SiC, AlN or $SiO_2$.

10.

The method for producing a GaN layered substrate according to 9, wherein the support substrate has a silicon oxide film formed on a bonding surface with the GaN film carrier (except for cases where the support substrate is made of $SiO_2$).

Advantageous Effects of Invention

According to the present invention, a C-plane sapphire substrate having a predetermined off-angle is subjected to a predetermined surface treatment, and GaN is epitaxially grown on the substrate to form a GaN film with good crystallinity whose surface is an N polar face, so that a GaN layered substrate whose surface is a Ga polar face can be obtained by one transfer. The transfer frequency can be made smaller than ever before, so that it is possible to reduce the process cost. Further, the amount of the GaN film lost by transfer can be reduced, so that it is possible to reduce the material cost. In addition, the in-plane variation in the thickness and the surface roughness, which increase with the transfer frequency, can be suppressed because the transfer frequency can be made smaller than ever before.

According to the present invention, a substrate subjected to epitaxial deposition, which easily increases in diameter, is used as a donor substrate for transfer of a GaN thin film, and therefore a GaN layered substrate with a lower cost and a larger diameter can be obtained as compared to a case where an expensive bulk GaN substrate with a small diameter is used as a donor substrate. The GaN layered substrate whose surface is a Ga polar face as obtained in the present invention can be formed into a GaN substrate with high pressure resistance and high characteristics by further carrying out epitaxial deposition with the substrate as a GaN template substrate.

DESCRIPTION OF EMBODIMENTS

Figure 1A:
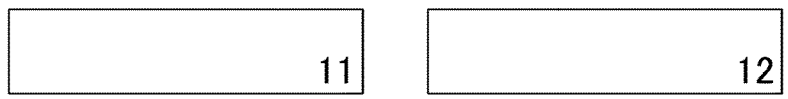
FIG. 1 is a diagram showing a production process in an embodiment of a method for producing a GaN layered substrate according to the present invention, where (a) shows preparation of a C-plane sapphire substrate and a support substrate, (b) shows surface treatment of a C-plane sapphire substrate, (c) shows epitaxial growth of GaN, (d) shows ion implantation treatment, (e) shows lamination and bonding, and (f) shows delamination and transfer of a GaN thin film.
Figure 1B:
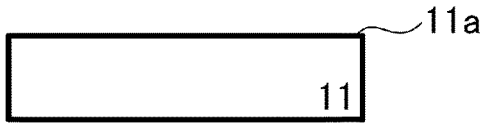

Hereinafter, a method for producing a GaN layered substrate according to the present invention is described. Here, the value range "A to B" includes the values at both ends of the range, and means A or more and B or less.

The method for producing a GaN layered substrate according to the present invention includes the steps of: subjecting a C-plane sapphire substrate having an off-angle of 0.5 to 5 degrees to a high-temperature nitriding treatment at 800° C. to 1,000° C. and/or a treatment for deposition of crystalline AlN on the C-plane sapphire substrate to carry out a surface treatment of the C-plane sapphire substrate; carrying out epitaxial growth of GaN on the surface of the surface-treated C-plane sapphire substrate to produce a GaN film carrier having a surface of an N polar face; forming an ion implantation region by carrying out ion implantation on the GaN film; laminating and bonding a support substrate with the GaN film-side surface of the ion-implanted GaN film carrier; and performing delamination at the ion-implanted region in the GaN film to transfer a GaN thin film onto the support substrate, to produce a GaN layered substrate having, on the support substrate, a GaN thin film whose surface is a Ga polar face.

Hereinafter, the method for producing a GaN layered substrate according to the present invention is described in detail with reference to FIG. 1.

As shown in FIG. 1, the method for producing a GaN layered substrate according to the present invention includes carrying out the following steps in the order presented: (a) preparation of a C-plane sapphire substrate and a support substrate (step 1), (b) surface treatment of the C-plane sapphire substrate (step 2), (c) epitaxial growth of GaN (step 3), (d) ion implantation treatment (step 4), (e) lamination and bonding (step 5), and (f) delamination and transfer of a GaN thin film (step 6).

(Step 1: Preparation of C-Plane Sapphire Substrate and Support Substrate)

First, a C-plane sapphire substrate 11 and a support substrate 12 are prepared (FIG. 1 (a)).

Here, the C-plane sapphire substrate 11 is a substrate made of sapphire ($\alpha$-$Al_2O_3$), whose substrate surface is a C-plane ((0001) plane). The c-axis off-angle (hereinafter, off-angle) of the C-plane sapphire substrate 11 is 0.5 to 5 degrees, preferably 2 to 3 degrees. When the off-angle is within the above-mentioned range, the surface of a GaN film 13 subsequently formed on the C-plane sapphire substrate 11 is an N polar face (hereinafter N face), the GaN film 13 is an epitaxially grown film having good smoothness and good crystallinity, and a GaN thin film 13a which is a transferred thin film with the GaN film 13 partially delaminated by an ion implantation delamination method and transferred to a support substrate 12 has excellent smoothness. The off-angle is an angle at which the substrate surface (face to be subjected to crystal growth) is slightly inclined in a specific direction from the close-packed face, and the c-axis off-angle is a magnitude of an inclination of the c-axis (normal-line axis of the C-plane) of the C-plane sapphire substrate 11 in the a-axis direction.

In addition, the arithmetic mean roughness Ra (JIS B0601: 2013, the same applies hereinafter) of the surface of the C-plane sapphire substrate 11 is preferably 0.5 nm or less. This enables firmer bonding when the sapphire substrate 11 is laminated and bonded to the support substrate 12 because the surface of the epitaxially deposited GaN film 13 becomes smoother.

The support substrate 12 is a substrate that ultimately supports the GaN thin film 13a, and is preferably made of Si, $Al_2O_3$, SiC, AlN or $SiO_2$. The constituent material thereof may be appropriately selected according to a use of a semiconductor device prepared by using the obtained GaN layered substrate.

The arithmetic mean roughness Ra of the surface of the support substrate 12 is preferably 0.5 nm or less. This enables firmer bonding when the C-plane sapphire substrate 11 is bonded to a GaN layer carrier having the GaN layer 13.

In addition, a bond film formed of silicon oxide (SiOx thin film (0<x≤2)) may be provided on the outermost layer of the support substrate 12 (except for cases where the support substrate 12 is made of $SiO_2$). Further, if the surface roughness of the support substrate 12 itself is not sufficiently small (e.g., the arithmetic mean roughness Ra of the surface of the support substrate 12 is more than 0.5 nm), this bond film may be treated by chemical mechanical polishing (CMP) or the like to smooth the surface of the support substrate 12. This enables further enhancement of the bonding strength between the C-plane sapphire substrate 11 and a GaN layer carrier having the GaN layer 13.

The thickness of this bond film is preferably about 300 nm to 1,000 nm.

(Step 2: Surface Treatment of C-Plane Sapphire Substrate)

Next, a surface treatment of the C-plane sapphire substrate 11 is carried out (FIG. 1 (b)).

That is, a high-temperature nitriding treatment of the C-plane sapphire substrate 11 at 800° C. to 1,000° C. and/or a treatment for depositing crystalline AlN on the C-plane sapphire substrate 11 are carried out.

Of these, the high-temperature nitriding treatment of the C-plane sapphire substrate 11 is a treatment in which the C-plane sapphire substrate 11 is heated to a temperature slightly lower than a deposition temperature for GaN epitaxial growth which is subsequently carried out, specifically 800° C. to 1,000° C., in a nitrogen-containing atmosphere to form an AlN film as the surface treatment layer 11a on the surface of the C-plane sapphire substrate 11. Preferably, the treatment is carried out in situ in the same treatment chamber of the MOCVD apparatus for epitaxial growth of the GaN film, and the treatment is carried out at a temperature (800° C. to 1,000° C.) slightly lower than a temperature for GaN epitaxial growth (1,050° C. to 1,100° C.). Here, if the treatment temperature is lower than 800° C., N-pole growth of the GaN film does not occur, and if the treatment temperature is higher than 1,000° C., smoothness deteriorates due to generation of GaN in epitaxial growth which is subsequently carried out. As a process gas, pure nitrogen is used, but ammonia gas can also be used. Use of ammonia gas enables generation of more active N atoms, leading to improvement of the surface morphology (crystal structure) of the GaN film. The high-temperature nitriding treatment time is preferably about 30 seconds to 30 minutes. By lengthening the treatment time, the surface morphology (crystal structure) of the GaN film can be improved.

The treatment for depositing crystalline AlN on the C-plane sapphire substrate 11 is a treatment in which a crystalline AlN film as a surface treatment layer 11a is formed on the C-plane sapphire substrate 11 by a chemical vapor deposition method (CVD method) or a physical vapor deposition method (PVD). This deposition treatment may be carried out under formation conditions allowing the surface of the C-plane sapphire substrate 11 to be covered with a crystalline AlN film (surface treatment layer 11a).

It is preferable that after a crystalline AlN film as the surface treatment layer 11a is deposited on the C-plane sapphire substrate 11 as described above and before epitaxial growth of GaN, heat treatment is carried out to stabilize the crystalline AlN film.

(Step 3: Epitaxial Growth of GaN)

Next, GaN is epitaxially grown on the surface of the surface-treated C-plane sapphire substrate 11 to form a GaN film 13 whose surface is an N polar face. In this way, a GaN film carrier is prepared.

As methods for epitaxially growing the GaN film, a molecular beam epitaxy (MBE) method, hydride vapor phase epitaxy (HVPE) method, and metal organic chemical vapor deposition (MOCVD) method are known, and the MOCVD method is most suitable and preferable for growing a low-defect GaN thin film directly on the sapphire substrate 11.

Here, it is preferable that the epitaxial growth of the GaN film 13 by the MOCVD method is carried out at a temperature higher than that of the high-temperature nitriding treatment in the step 2 (i.e. higher than 1,000° C.), and a temperature of higher than 1,000° C. and 1,100° C. or lower, at which good balance is achieved between the film quality of the GaN film 13 and the deposition rate. In addition, trimethylgallium (TMG) and ammonia ($NH_3$) may be used as the process gas, and hydrogen may be used as the carrier gas.

The thickness of the GaN film 13 depends on the thickness of the GaN thin film 13a to be finally obtained, and is, for example, 0.5 μm to 10 μm.

It is preferable that after the C-plane sapphire substrate 11 is subjected to the surface treatment in step 2, a GaN buffer layer is formed at a low temperature, for example 700° C. or lower, and GaN is then epitaxially grown on the GaN buffer layer by the MOCVD method to form the GaN film 13.

Here, in deposition of the GaN buffer layer, the GaN film 13 on the buffer layer does not grow well at an N pole if the deposition temperature is higher than 700° C., and deposition itself does not proceed if the deposition temperature is lower than 400° C. Therefore, the GaN buffer layer is deposited preferably at 400° C. to 700° C., more preferably at 400° C. to 600° C. In addition, a buffer effect may not be obtained if the thickness of the GaN buffer layer is excessively small, and the film quality may be deteriorated if the thickness of the GaN buffer layer is excessively large. Therefore, the thickness of the GaN buffer layer is preferably 15 nm to 30 nm, more preferably 20 nm to 25 nm.

Figure 1C:
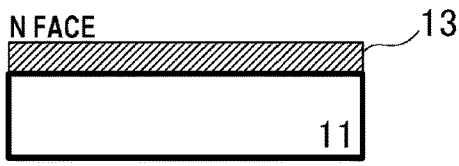

Through the foregoing series of steps of forming the GaN film 13, the GaN film 13 with very good crystallinity whose surface is an N face is deposited on the C-plane sapphire substrate 11 (FIG. 1(c) shows the process up to this point).

Here, the crystal surface of a compound semiconductor such as GaN has polarity. For example, the surfaces of a single-crystal GaN film composed of constituent elements Ga and N inevitably have a polar face which is formed of (terminated with) Ga atoms and on which dangling bonds of the Ga atoms are exposed (Ga polar face (also referred to as a Ga face)) and a polar face which is formed of (terminated with) N atoms and on which dangling bonds of the N atoms are exposed (N polar face (also referred to as an N face)).

In addition, GaN has a hexagonal crystal structure, and the polar face thereof appears on the close-packed face of the crystal lattice. The close-packed face of a hexagonal compound semiconductor crystal is a {0001} plane, and the (0001) plane is not equivalent to a (000-1) plane. The former is a plane on which cation atoms are exposed, and the latter is a plane on which anion atoms are exposed. In gallium nitride (GaN), the (0001) plane is a Ga face and the (000-1) plane is an N face.

After the GaN film 13 is formed by the epitaxial growth, a silicon oxide (SiOx (0<x≤2)) film as a bond layer for lamination to the support substrate 12 may be further formed on the GaN film 13 to obtain the GaN film carrier. Here, the thickness of the silicon oxide film is preferably 200 nm to 1,000 nm.

(Step 4: Ion Implantation to GaN Film 13)

Figure 1D:
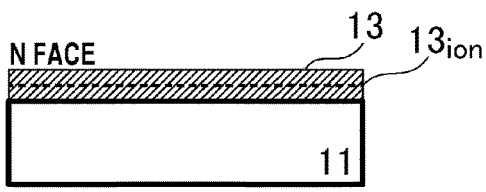

Next, ion implantation is performed to the surface of the GaN film 13 of the GaN film carrier to form a layered ion implantation region $13_{ion}$ in the GaN film 13 (FIG. 1(d)).

At this time, it is preferable to use hydrogen ions ($H^+$) and/or hydrogen molecule ions ($H_2^+$) as injection ions.

The implantation energy determines the ion implantation depth (i.e. the thickness of the delaminated film (GaN thin film 13a)), and is preferably 110 keV to 160 keV. If the implantation energy is 100 keV or more, the thickness of the GaN thin film 13a can be 500 nm or more. On the other hand, if the implantation energy is more than 160 keV, implantation damage may expand, leading to deterioration of the crystallinity of the delaminated thin film.

The dose is preferably $1.0 \times 10^{17}$ atom/cm$^2$ to $3.0 \times 10^{17}$ atom/cm$^2$. This enables formation of an ion implantation region $13_{ion}$ as a separating layer (embrittlement layer) in the GaN film 13 and suppression of a rise in temperature of the GaN film carrier. The ion implantation temperature is room temperature. Since the GaN film carrier may break at a high temperature, the GaN film carrier may be cooled.

Here, the ion implantation treatment may be carried out on the GaN film carrier with the GaN film 13 as formed in step 3, but if the surface of the GaN film 13 as formed is rough, the ion implantation depth becomes uneven depending on irregularities on the surface, leading to expansion of irregularities on the delaminated face (surface) of the GaN thin film 13a after delamination.

Thus, before the ion implantation, the ion implantation face of the GaN film carrier may be smoothed to an arithmetic mean roughness of preferably 0.3 nm or less, more preferably 0.2 nm or less.

For example, the surface of the GaN film 13 formed in step 3 may be polished by CMP and/or etched or the like to smooth the surface to an arithmetic average roughness Ra of preferably 0.3 nm or less, more preferably 0.2 nm or less.

Alternatively, when a silicon oxide film is formed as a bond layer on the GaN film 13 (i.e. the GaN film 13 as formed or smoothed by polishing and/or etching), the surface of the silicon oxide film may be polished by CMP and/or etched or the like to smooth the surface to an arithmetic average roughness Ra of preferably 0.3 nm or less, more preferably 0.2 nm or less. The smoothing is particularly effective in a case where the thickness of the GaN film 13 is small and it is difficult to flatten the surface by polishing or the like.

By smoothing a face of the GaN film carrier which is to be subjected to ion implantation (i.e. the surface of the GaN film 13 or the silicon oxide film as the bond layer), the ion implantation depth can be made uniform in the ion implantation treatment that is subsequently carried out, and hence, a delamination and transfer layer (GaN thin film 13a) having a smooth surface (small surface roughness) can be obtained when the GaN carrier is laminated to the support substrate 12 and then delaminated.

(Step 5: Lamination and Bonding of GaN Film Carrier and Support Substrate 12)

Figure 1E:
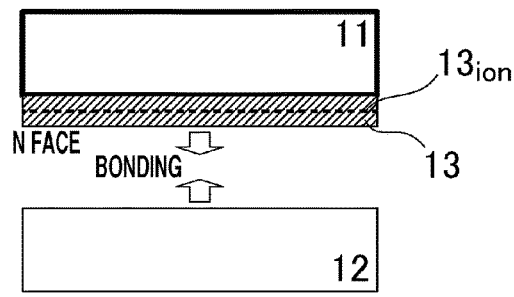

Next, the GaN film 13-side surface of the GaN film carrier, which has been subjected to ion implantation, is laminated and bonded to the support substrate 12 (FIG. 1(e)).

Here, when the GaN film carrier, on which the bond layer (silicon oxide film) is not formed, is laminated to the support substrate 12, the surface (N face) of the GaN film 13 of the GaN film carrier is bonded to the surface of the support substrate 12. That is, a laminated structure of C-plane sapphire substrate 11/surface-treated layer 11a/(GaN buffer layer)/GaN film 13 (N face)/support substrate 12 is obtained.

In addition, when the GaN film carrier with the bond layer (silicon oxide film) formed on at least one of the surfaces is laminated to the support substrate 12, the surface (N face) of the GaN film 13 of the GaN film carrier is bonded to the surface of the support substrate 12 with the bond layer (silicon oxide film) interposed therebetween. That is, a laminated structure of C-plane sapphire substrate 11/surface-treated layer 11a/(GaN buffer layer)/GaN film 13 (N face)/bond layer (silicon oxide film)/support substrate 12 is obtained.

It is preferable that before the lamination, one or both of the ion implantation face of the GaN film carrier and the bonding face of the support substrate 12 are subjected to a plasma treatment as a surface activation treatment.

For example, the GaN film carrier and/or the support substrate 12 to be subjected to the surface activation treatment is set in a common parallel plate type plasma chamber, a high frequency of about 13.56 MHz with 100 W is applied, and Ar, $N_2$, and $O_2$ are introduced as process gases to carry out the treatment. The treatment time is 5 seconds to 30 seconds. This activates the surface of a target substrate, leading to an increase in bonding strength after lamination.

In addition, when annealing is carried out after lamination at about 200° C. to 300° C., firmer bonding is performed.

(Step 6: Delamination and Transfer of GaN Thin Film)

Figure 1F:
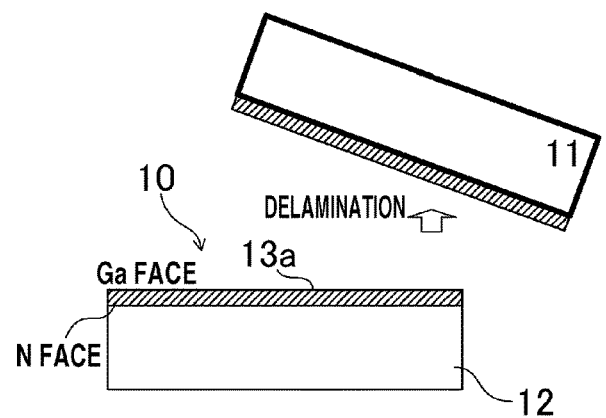

Next, the GaN thin film 13a is transferred onto the support substrate 12 by delamination at the ion implantation region $13_{ion}$ in the GaN film 13 (FIG. 1(f)).

The delamination treatment may be a treatment commonly carried out by an ion implantation delamination method. It is possible to apply, for example, mechanical delamination such as insertion of a blade, optical delamination by laser light irradiation or the like, or physical impact delamination with the aid of a jet water flow, an ultrasonic wave, or the like.

This enables preparation of the GaN layered substrate 10 in which the GaN thin film 13a with good crystallinity and a smooth surface, whose surface is a Ga polar face, is present on the support substrate 12.

While the surface of the GaN thin film 13a transferred after delamination is sufficiently smooth, the surface may be made smoother by polishing or the like depending on required characteristics of a device in which the GaN layered substrate 10 is used. A GaN film can be further epitaxially grown on the GaN layered substrate 10 to produce a low-defect and thick GaN substrate.

As a method for determining the polar face of the surface of the GaN thin film 13a of the GaN layered substrate 10, a determination may be made by, for example, observing a difference in etching rate with a KOH aqueous solution. That is, the etching rate of the N face is higher than that of the Ga face. For example, the polar face can be determined from the fact that when the substrate is immersed in a 2 mol/L KOH aqueous solution at 40° C. for 45 minutes, the Ga face is not etched, whereas the N face is etched.

EXAMPLES

Although Examples and Comparative Examples are given below to more concretely illustrate the invention, the invention is not limited by these Examples.

Example 1

A GaN layered substrate was prepared under the following conditions.

Example 1-1

A C-plane sapphire substrate with a diameter of 100 mm, a thickness of 525 μm, an arithmetic mean roughness Ra of 0.3 nm and a C-axis off-angle of 3 degrees was prepared. The substrate was cleaned by RCA cleaning, and then subjected to a high-temperature nitriding treatment (process gas: pure nitrogen) at a substrate temperature of 900° C. for 30 minutes by use of a MOCVD apparatus, and a GaN buffer layer was subsequently deposited with a thickness of 20 nm at a substrate temperature of 400° C., and then epitaxially grown at a substrate temperature of 1,050° C. by use of TMG and $NH_3$ as process gases to deposit a GaN film with a thickness of 2 μm. The arithmetic mean roughness Ra of the GaN film was 8 nm.

Subsequently, a silicon oxide film with a thickness of 1 μm was deposited on the GaN film by a plasma CVD method, and the silicon oxide film was then polished to 200 nm with a CMP apparatus. The arithmetic mean roughness Ra of the obtained GaN film carrier was 0.3 nm.

Next, the GaN film carrier was ion-implanted with hydrogen molecule ions $H_2^+$ to the silicon oxide film surface at an implantation energy of 160 keV and a dose of $3.0 \times 10^{+17}$ atom/$cm^2$.

Next, a Si substrate with a diameter of 100 mm and a thickness of 525 μm was prepared, and a thermal oxide film with a thickness of 300 nm was formed on the Si substrate. The arithmetic mean roughness Ra of the Si substrate after formation of the thermal oxide film was 0.5 nm.

An Ar plasma treatment were carried out on the thermal oxide film surface of the Si substrate and the silicon oxide film (ion implantation face) surface of the GaN film carrier, respectively. Subsequently, the Ar plasma-treated surfaces were bonded together, and then annealed at 200° C. for 12 hours in a nitrogen atmosphere. After annealing, delamination was performed by inserting a metal blade into the ion implantation region of the GaN film, and the GaN thin film was transferred onto the Si substrate to obtain a GaN layered substrate.

The arithmetic mean roughness Ra of the surface of the GaN thin film of the obtained GaN layered substrate was 8 nm. In addition, the crystallinity of the GaN thin film of the obtained GaN layered substrate was evaluated by an X-ray locking curve method. Specifically, a tilt distribution (half-value width) in the locking curve (ω scan) of reflection at the GaN (0002) plane of the GaN thin film was determined by X-ray diffraction, and the result showed a good crystallinity of 300 arcsec.

In addition, for determining the polar face of the surface of the GaN thin film, the sample was immersed in a 2 mol/L KOH aqueous solution at 40° C. for 45 minutes, and the surface was then observed. The result showed that the surface of the GaN thin film was not etched, and the surface of the GaN thin film was a Ga face.

Example 1-2

With respect to Example 1-1, a GaN film with a thickness of 2 μm was epitaxially grown, the surface of the GaN film was then polished so that the surface had an arithmetic mean roughness Ra of 0.2 nm, and the GaN film was transferred. Except for the above, the same procedure as in Example 1-1 was carried out to obtain a GaN layered substrate.

The arithmetic mean roughness Ra of the surface of the GaN thin film of the obtained GaN layered substrate was 0.3 nm. In addition, the crystallinity of the GaN thin film of the obtained GaN layered substrate was evaluated by an X-ray locking curve method as in Example 1-1, and the result showed that the FWHM was 250 arcsec. Thus, the GaN thin film was comparable in crystallinity to that of Example 1.

In addition, the polar face of the surface of the GaN thin film was determined in the same manner as in Example 1-1, and the result showed that the polar face was a Ga face.

Comparative Example 1-1

With respect to Example 1-1, a C-plane sapphire substrate having a c-axis off-angle of 0.05 degrees (an arithmetic mean roughness Ra of 0.3 nm) was used. Except for the above, the same procedure as in Example 1-1 was carried out to obtain a GaN layered substrate. The arithmetic mean roughness Ra of the GaN film after deposition of the GaN film was 60 nm, and the arithmetic mean roughness Ra of the GaN film carrier in which the silicon oxide film was polished by CMP was 0.2 nm.

The arithmetic mean roughness Ra of the surface of the GaN thin film of the obtained GaN layered substrate was 60 nm. In addition, the crystallinity of the GaN thin film of the obtained GaN layered substrate was evaluated by an X-ray locking curve method as in Example 1-1, and the result showed that the FWHM was 600 arcsec. Thus, the GaN thin film had poor crystallinity.

In addition, the polar face of the surface of the GaN thin film was determined in the same manner as in Example 1-1, and the result showed that the polar face was a Ga face.

Comparative Example 1-2

With respect to Example 1-1, a C-plane sapphire substrate having a c-axis off-angle of 6 degrees (an arithmetic mean roughness Ra of 0.3 nm) was used. Except for the above, the same procedure as in Example 1-1 was carried out to obtain a GaN layered substrate. The arithmetic mean roughness Ra of the GaN film after deposition of the GaN film was 80 nm, and the arithmetic mean roughness Ra of the GaN film carrier in which the silicon oxide film was polished by CMP was 0.3 nm.

The arithmetic mean roughness Ra of the surface of the GaN thin film of the obtained GaN layered substrate was 80 nm. In addition, the crystallinity of the GaN thin film of the obtained GaN layered substrate was evaluated by an X-ray locking curve method as in Example 1-1, and the result showed that the FWHM was 800 arcsec. Thus, the GaN thin film had poor crystallinity.

In addition, the polar face of the surface of the GaN thin film was determined in the same manner as in Example 1-1, and the result showed that the polar face was a Ga face.

The above results are shown in Table 1. It is clearly shown that the present invention provided a GaN layered substrate having excellent smoothness and crystallinity can be provided. The surface roughness Ra in the table is an arithmetic means roughness Ra

REFERENCE SIGNS LIST

10 GaN composite substrate
11 C-plane sapphire substrate
11a Surface-treated layer
12 Support substrate
13 GaN film
13a GaN thin film
$13_{ion}$ Ion implantation region

The invention claimed is:

1. A method for producing a GaN layered substrate, comprising the steps of:
    subjecting a C-plane sapphire substrate having an off-angle of 0.5 to 5 degrees to a high-temperature nitriding treatment at 800° C. to 1,000° C. and/or a treatment for deposition of crystalline AlN on the C-plane sapphire substrate to carry out a surface treatment of the C-plane sapphire substrate;
    carrying out epitaxial growth of GaN on the surface of the surface-treated C-plane sapphire substrate, so that a GaN film is formed on the surface of the surface-treated C-plane sapphire substrate, whereby a GaN film carrier having a surface of an N polar face is produced;
    forming an ion implantation region by carrying out ion implantation on the GaN film of the GaN film carrier;
    laminating and bonding a support substrate with a surface of the GaN film of the GaN film carrier, to which the ion implantation has been carried out; and
    performing delamination at the ion-implanted region in the GaN film to transfer a GaN thin film onto the support substrate, to obtain a GaN layered substrate having, on the support substrate, the GaN thin film whose surface is a Ga polar face.

2. The method for producing a GaN layered substrate according to claim 1, wherein the GaN epitaxial growth is carried out at a higher temperature than the high-temperature nitriding treatment.

TABLE 1

| | GaN film carrier | | | | | | | | | Evaluation result of GaN transfer thin film | |
|---|---|---|---|---|---|---|---|---|---|---|---|
| | | High-temperature nitriding treatment Treatment conditions | GaN buffer layer Thickness (nm) | GaN film | | | Silicon oxide | | Support substrate | | |
| | C-plane sapphire substrate c-axis off-angle | | | Deposition temperature | Surface roughness Ra after film deposition | Polishing by CMP | film | | Surface roughness Ra | Substrate configuration | Surface roughness Ra | Crystallinity* |
| | | | | | | | Deposition | Polishing by CMP | | | | |
| Example 1-1 | 3 degrees | 900° C./ 30 min | 20 nm | 1,050° C. | 8 nm | None | Done | Done | 0.3 nm | Si substrate (Thermal oxide formation) | 8 nm | 300 arcsec |
| Example 1-2 | 3 degrees | 900° C./ 30 min | 20 nm | 1,050° C. | 6 nm | Done | None | None | 0.2 nm | Si substrate (Thermal oxide formation) | 0.3 nm | 250 arcsec |
| Comparative Example 1-1 | 0.05 degrees | 900° C./ 30 min | 20 nm | 1,050° C. | 60 nm | None | Done | Done | 0.2 nm | Si substrate (Thermal oxide formation) | 60 nm | 600 arcsec |
| Comparative Example 1-2 | 6 degrees | 900° C./ 30 min | 20 nm | 1,050° C. | 80 nm | None | Done | Done | 0.3 nm | Si substrate (Thermal oxide formation) | 80 nm | 800 arcsec |

*Full width at half maximum (FWHM) in locking curve (ω scan) of reflection at GaN (0002) plane While the present invention has been described with the embodiments described above, the present invention is not limited to these embodiments, and changes such as other embodiments, additions, modifications and deletions can be made as long as they are conceivable by a person skilled in the art. Any of the aspects is within the scope of the present invention as long as the effects of the present invention are exhibited.

3. The method for producing a GaN layered substrate according to claim 1, wherein the GaN epitaxial growth is carried out by a MOCVD method.

4. The method for producing a GaN layered substrate according to claim 1, wherein after the surface treatment of the C-plane sapphire substrate is carried out, a GaN buffer layer is formed at 700° C. or lower, and the GaN epitaxial growth is then carried out on the GaN buffer layer.

5. The method for producing a GaN layered substrate according to claim 4, wherein the thickness of the GaN buffer layer is 15 nm to 30 nm.

6. The method for producing a GaN layered substrate according to claim 1, wherein after the GaN film is formed by the epitaxial growth, a silicon oxide film is further formed on the GaN film to obtain the GaN film carrier.

7. The method for producing a GaN layered substrate according to claim 1, wherein before the ion implantation, the surface of the GaN film is smoothed to an arithmetic mean roughness Ra of 0.3 nm or less.

8. The method for producing a GaN layered substrate according to claim 1, wherein the ion implantation is a treatment using hydrogen ions ($H^+$) and/or hydrogen-molecule ions ($H_2^+$) at an implantation energy of 100 keV to 160 keV and a dose of $1.0 \times 10^{17}$ atom/cm$^2$ to $3.0 \times 10^{17}$ atom/cm$^2$.

9. The method for producing a GaN layered substrate according to claim 1, wherein the support substrate is made of Si, $Al_2O_3$, SiC, AlN or $SiO_2$.

10. The method for producing a GaN layered substrate according to claim 9, wherein the support substrate has a silicon oxide film formed on a bonding surface with the GaN film carrier except for cases where the support substrate is made of $SiO_2$.

11. The method for producing a GaN layered substrate according to claim 1, wherein thickness of the GaN thin film is 500 nm or greater and less than thickness of the GaN film.

* * * * *